(12) United States Patent
Lee et al.

(10) Patent No.: US 6,507,296 B1
(45) Date of Patent: Jan. 14, 2003

(54) CURRENT SOURCE CALIBRATION CIRCUIT

(75) Inventors: Yvette P. Lee, Austin, TX (US); Marwan N. Hassoun, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/930,032

(22) Filed: Aug. 14, 2001

(51) Int. Cl.[7] ................................................. H03M 1/10
(52) U.S. Cl. ...................................... 341/120; 341/144
(58) Field of Search ................................. 341/144, 120, 341/141, 118

(56) References Cited

U.S. PATENT DOCUMENTS 5,666,118 A * 9/1997 Gersbach .................... 341/120
5,955,980 A * 9/1999 Hanna ........................ 341/120
6,329,941 B1 * 12/2001 Farooqi ...................... 341/145
6,331,830 B1 * 12/2001 Song et al. .................. 341/121

\* cited by examiner

*Primary Examiner*—Peguy JeanPierre
(74) *Attorney, Agent, or Firm*—Fogg, Slifer & Polglaze; H. C. Chan

(57) ABSTRACT

A current source calibration circuit and methodology reduce noise generated by current switching. In one embodiment, the calibration circuit provides a random or pseudo-random clock signal to control a switching of calibration circuit. A clock signal generator has been described that provide a number of clock signals having different phases. In one embodiment, the clock signals are used to select a current source of a DAC for calibration. By using a random clock to select the current source, noise, which is generated by switching a primary current source with a backup current source, is spread out over a wider frequency range.

18 Claims, 4 Drawing Sheets

CURRENT SOURCE CALIBRATION CIRCUIT

FIELD OF THE INVENTION

The present invention relates generally to calibration of current sources and in particular the present invention relates to a clocking scheme for calibration of current sources.

BACKGROUND OF THE INVENTION

Digital-to-analog (D/A) conversion is the process of converting digital codes into a continuous range of analog signal levels. Major factors that determine the quality of performance of DACs are resolution, sampling rate, speed, and linearity. Generally, the accuracy of the DAC's measurement and conversion is specified by the converter's linearity. "Integral linearity" is a measure of linearity over the entire conversion range. It is defined as the deviation from a straight line drawn between the maximum point and through zero (or the offset value) of the conversion range. "Differential linearity" is the linearity between adjacent steps of the analog output. Differential linearity is a measure of the monotonicity of the converter. The converter is said to be monotonic if increasing input values result in increasing output values.

Digital codes are typically converted to analog voltages by assigning a voltage weight, or current weight, to each bit in the digital code and summing the voltage or current weights of the entire code. This type of DAC is called a binary weighted DAC. DACs that produce analog current outputs usually have a faster settling time and better linearity than those that produce a voltage output.

As is well known in the art, a "segmented" DAC design converts digital codes to analog signals by activating a number of weighted segments proportional to the input digital code and summing the activated segments to form the analog output signal. In segmented DACs, two or more reference currents of appropriate ratio dictated by the percentage of segmentation are required to calibrate the current sources in each segment. In non-segmented DACs, reference current sources can be calibrated using a "golden" current source to improve accuracy. Sequentially calibrating numerous current sources, however, can create problems during operation.

For the reasons stated above, and for other reasons stated below which will become apparent to those skilled in the art upon reading and understanding the present specification, there is a need in the art for a calibration circuit and methodology that can calibrate numerous current sources without adversely affecting operation characteristics.

SUMMARY OF THE INVENTION

The above-mentioned problems with current source calibration and other problems are addressed by the present invention and will be understood by reading and studying the following specification.

In one embodiment, a current source calibration circuit comprises first and second current sources, a calibration circuit, a switching circuit to selectively couple the first and second current sources to the calibration circuit in response to a pseudo-random clock signal, and a clock generator to provide the pseudo-random clock signal.

In another embodiment, a digital-to-analog (DAC) circuit comprises a plurality of sub-DACs each comprising at least one current source, a calibration circuit coupleable to calibrate the current sources, and a clock generator circuit coupled to the calibration circuit to provide a clock signal having a random frequency.

A digital-to-analog (DAC) circuit, of an embodiment, comprises a plurality of sub-DACs each comprising, a primary current source, a backup current source, and switching circuitry to couple the primary and backup current sources to calibration circuitry. The DAC includes a clock generator circuit coupled to the switching circuitry to provide a plurality of clock signals each having a random frequency.

A method of calibrating a plurality of current sources comprises generating a clock signal having a random frequency, and coupling the plurality of current sources to a calibration circuit in response to the clock signal.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Current source mismatch due to process variations in current-mode digital-to-analog data converters (DAC's) results in linearity errors that reduce resolution and accuracy. Calibration can be applied to the current sources to improve current matching and performance. However, a large number of current sources may be required to implement a high resolution DAC. Each of the current sources, therefore, need to be calibrated.

In one calibration scheme, primary current sources of the DAC are calibrated against a single reference current source. A redundant current source is provided to replace a primary current source that is being calibrated, such that the output of the DAC does not have to be disabled to calibrate the primary current sources. The redundant current source is also calibrated during operation. As explained below, calibration is applied to one current source at a time and a calibration clock controls the sequence of calibration. The calibration operation changes from one current source to the next at the rising (or falling) edge of the calibration clock. As this process continues, each current source is periodically calibrated.

Figure 1:
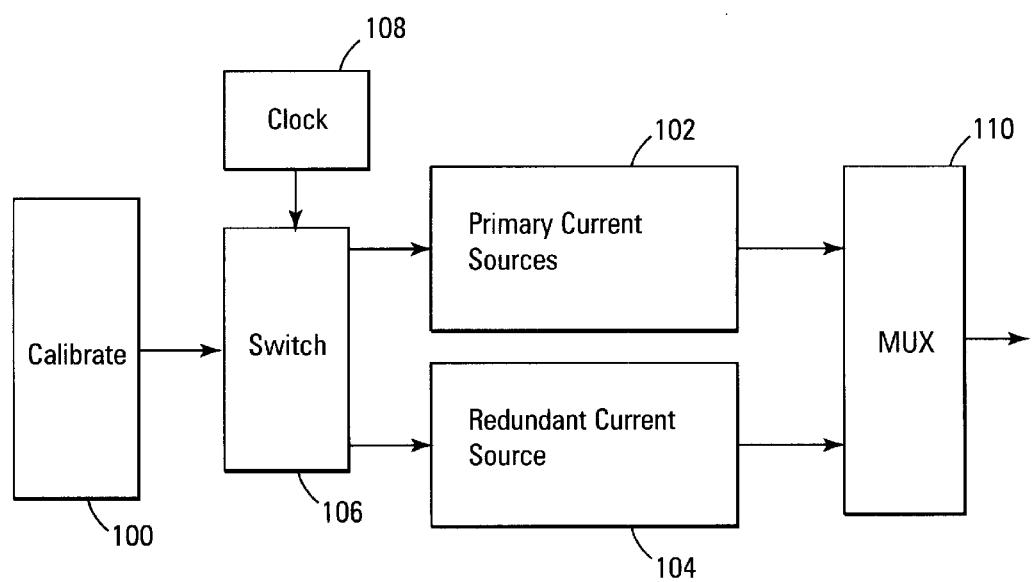
FIG. 1 is a block diagram of the present invention.

Referring to the block diagram of FIG. 1, a calibration circuit 100 is coupled to a primary current source 102 and a redundant current source 104 via a switch circuit 106. The switch circuit is controlled in response to a clock circuit 108.

The output of the current sources can be multiplexed 110 to provide uninterrupted current for use in a circuit, such as a digital-to-analog converter. Details of the calibration circuit are not provides herein, and it will be appreciated by those skilled in the art with the benefit of the present description that any current calibration circuit can be used with the present invention.

A problem can be encountered with switching currents while performing this redundant current calibration scheme. That is, the periodic calibration, which involves switching of currents, introduces a tone in the output spectrum of the DAC at the frequency of the calibration clock. This can reduce the performance of the DAC or other circuit that includes the current sources. The problem can be further compounded if a segmented DAC is used. For example, two or more current sources from different segments may be calibrated at the same time if the same calibration clock is shared between segments. This further increases the energy of the undesired tone.

Embodiments of the present invention provide clocking schemes for calibrating multiple current sources. In one embodiment, a random sequence is used to generate a random clock signal from clock 108. The clock signal, therefore, has a varying period. As used herein a random clock signal is a clock signal that has a random period. Because the calibration circuit switches from one current source to the next at the clock signal edge(s) and the clock period is not constant, switching noises due to calibration do not occur periodically and do not appear as a single tone at a particular frequency in the output spectrum. In another embodiment, clocks of different phases can also be applied to different segments to lower the probability of having current sources from different segments being calibrated at the same time.

Figure 2:
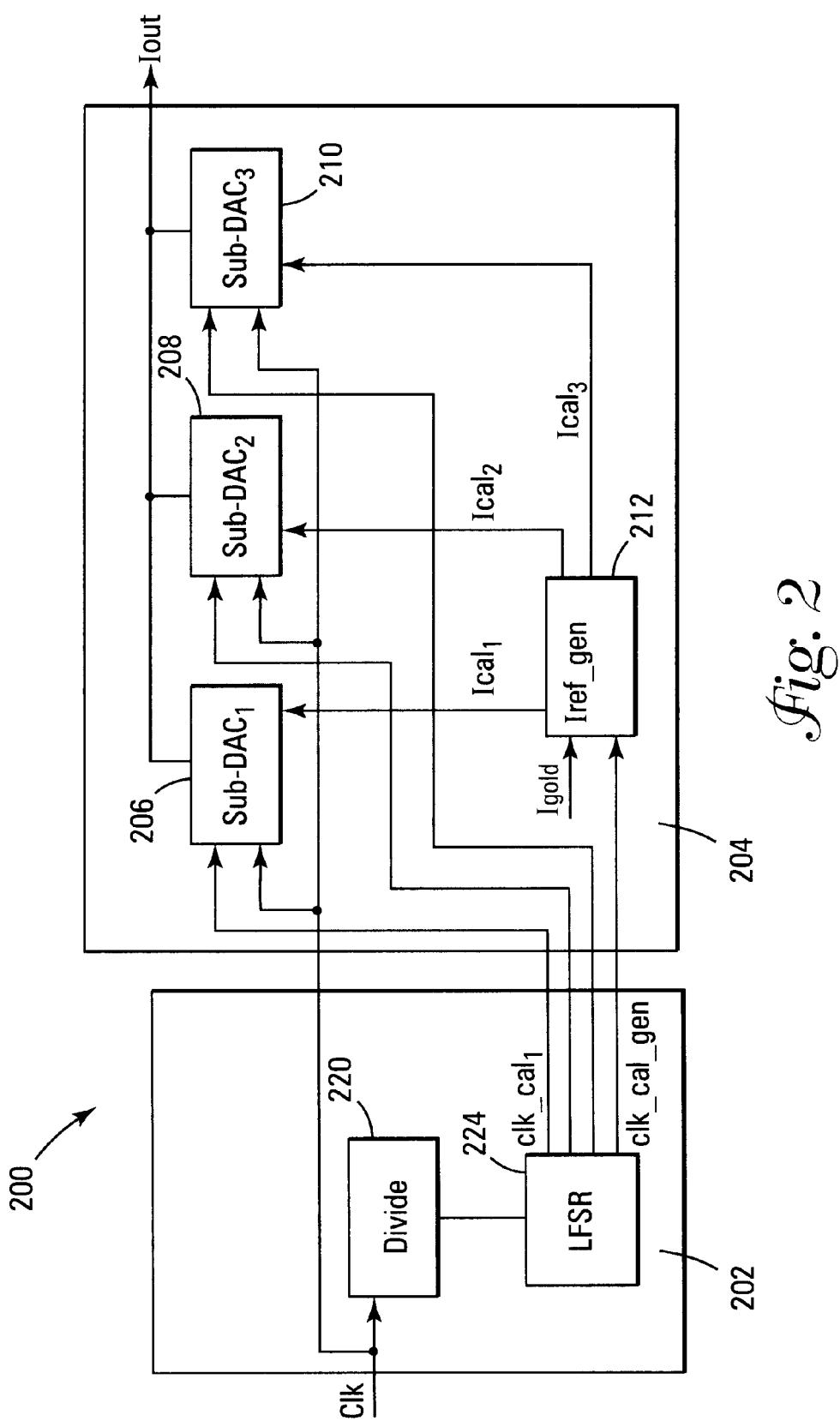
FIG. 2 illustrates a self-calibrated current-mode n-bit digital-to-analog circuit with a pseudo-random sequence generator.

In one embodiment, the present invention provides a self-calibrated current-mode n-bit digital-to-analog circuit 200 with a pseudo-random sequence generator 202, as shown in FIG. 2. The basic architecture of a segmented DAC of the present invention and a current source calibration scheme are described below. An x-y-z segmentation n-bit DAC (i.e., an n-bit DAC that consists of 3 sub-DAC's) is illustrated in FIG. 2. In the x-y-z segmentation DAC 204, the first x most-significant-bits (MSB) of the digital input signals are converted to an analog signal in a sub-DAC 206, referred to as sub-$DAC_1$. The next y bits are converted in sub-$DAC_2$ 208, and conversion of the last z bits are performed in sub-$DAC_3$ 210. Within each segment, thermometer coding is used and unit current sources are connected to a switch controlled by the signal coming from a binary-to-thermometer decoder. The unit currents in sub-$DAC_3$ are referred to herein as Iunit. This is also referred to as the least-significant-bit (LSB) current, $I_{LSB}$. The number of unit currents in this sub-DAC is determined as $(2^z-1)$. It follows that the unit current in sub-$DAC_2$ is $2^z*I_{unit}$ and there is a total of $(2^y-1)$ unit currents in this sub-DAC. The unit current in sub-$DAC_1$ is $2^{(y+z)}*I_{unit}$, and there is a total of $(2^x-1)$ in this sub-DAC.

Since the unit currents in the sub-DAC's are different, different reference currents, denoted as $Ical_1, Ical_2 \ldots Ical_n$, are used for calibration. The reference currents are generated from a reference current calibration circuit 212, referred to as Iref_gen. The reference currents are made up of unit current sources that have values of the smallest reference current such as $Ical_n$. Matching between reference currents is desired to ensure matching between sub-DAC's and this is achieved by calibrating these unit currents source against a single golden current, Igold. Igold also has the value of the smallest reference current.

If a sub-DAC is subjected to calibration, one extra current source is provided to replace the current source that is being calibrated, see FIG. 1. Thus, background calibration can be performed on the current sources. For a k-bit sub-DAC, $2^k$ current sources are provided where there are $2^k-1$ primary current sources and one redundant current source. Switch circuit 106 of FIG. 1 can include a shift register to control coupling the current sources to the calibration circuitry.

Figure 3:
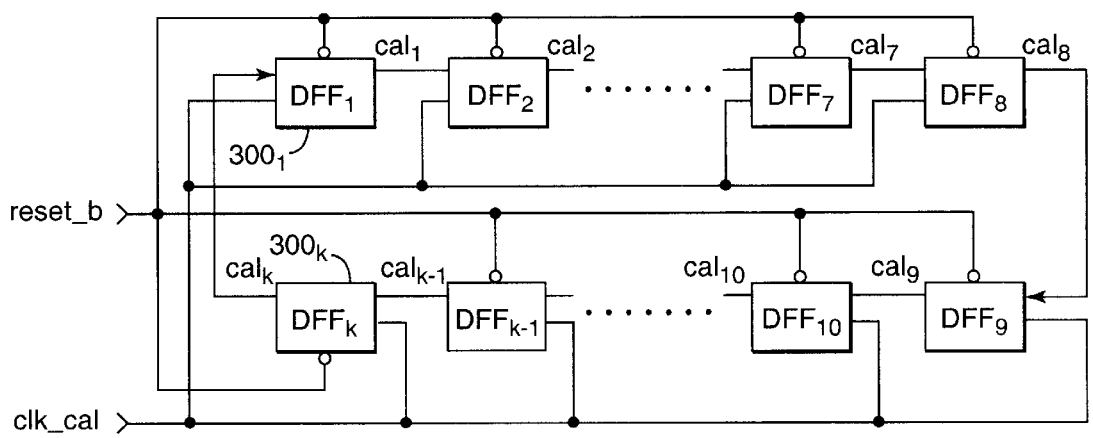
FIG. 3 is a schematic diagram of a shift register.

A shift register shown in FIG. 3 is clocked by clk_cal and can be used to control the calibration of each current source in each sub-DAC. Signals $cal_1$ to $cal_{k+1}$ are used to switch the current sources into or out of calibration mode. When reset_b is low, $cal_1$ to $cal_{k-1}$ are reset to low and $cal_k$ is set to high, putting the $k^{th}$ current sources into calibration mode. The remaining current sources are used to generate the output current. At the next rising edge (or falling edge if the D-flip flop is negative edge triggered) of clk_cal, the outputs of each DFF $300_1$–$300_k$ are shifted to its adjacent DFF (clockwise in this configuration). After this shifting, cal2 to $cal_k$ are now low and call is now high. The $1^{st}$ current source is placed in calibration mode and the remaining current sources, 2 to (k+1), are used for the output. This process continues until all current sources have been calibrated. The calibration cycle is then repeated. If clk_cal is a periodic signal, the calibration operation switches periodically from one current source to the next. This periodic event, which associates with switching noise, introduces a single tone at the frequency of clk_cal in the output spectrum of the DAC, reducing the spur-free dynamic range (SFDR). SFDR of a DAC of the present invention is improved by using the random sequence for clk_cal. The rising edges of the calibration clock signal do not occur periodically, and the calibration does not switch from one current source to the next after a fixed interval of time. Thus, switching noise is not generated periodically and the energy due to such noise does not appear at any particular frequencies. In contrast, the energy is spread out and the SFDR of the DAC is increased.

Figure 4:
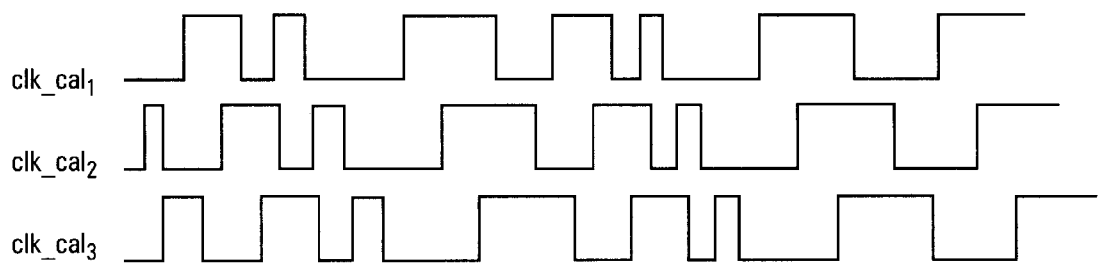
FIG. 4 is a timing diagram of clock signals.

Referring again to FIG. 2, clk_$cal_1$, clk_$cal_2 \ldots$ clk_$cal_n$, and clk_cal_gen are the clocks used for controlling the calibration in sub-$DAC_1 \ldots$ sub-$DAC_n$, and Iref_gen, respectively. The pseudo-random sequence generator 202 generates clk_$cal_1$, clk_$cal_2 \ldots$ clk_$cal_n$, and clk_cal_gen. The system clock can be divided using an optional divider circuit 220 to provide a slower clock for calibration. A linear feedback shift register (LFSR) 224 then generates the random sequence for each clock signal used. Thus, clk_$cal_1$, clk_$cal_2 \ldots$ clk_$cal_n$, and clk_cal_gen have the same random sequence of different phases, see FIG. 4.

Figure 5:
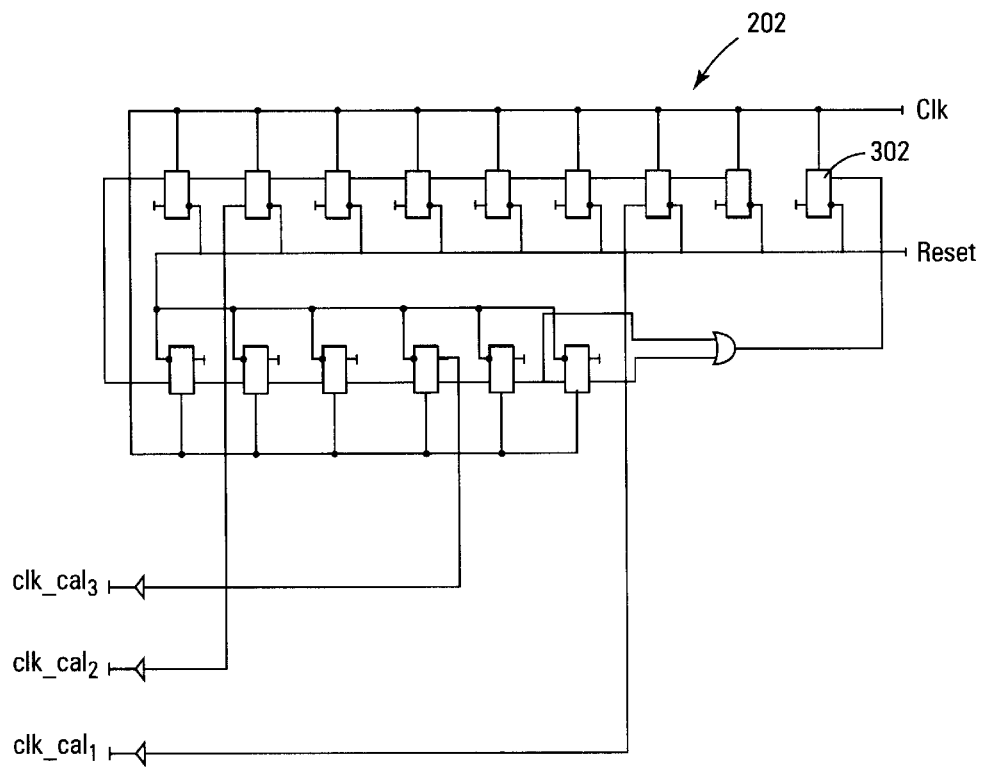
FIG. 5 illustrates a pseudo-random sequence generator of an embodiment of the present invention.

Referring to FIG. 5, an example embodiment of a pseudo-random sequence generator 202 with 15 registers 302 and three outputs of three different phases is illustrated. The length of the repeating sequence is $(2^{15}-1)$ or 32767. The three random sequences of different phases are taken from different points in the shift register. These three outputs are used to provide clk_$cal_1$, clk_$cal_2$, and clk_$cal_3$ for the shift register of FIG. 3. It will be appreciated by those in the art with the benefit of the present description that the number of output is selected based upon the design of the DAC and the present invention is not limited to three clock calibration signals.

CONCLUSION

A current source calibration circuit and methodology have been described to reduce noise generated by current switching as a result of periodically calibrating each current source.

In one embodiment, the calibration circuit provides a random or pseudo-random clock signal to control a switching of calibration circuit. A clock signal generator has been described that provide a number of clock signals having different phases and random periods. In one embodiment, the clock signals are used to select a current source of a DAC for calibration. By using a random clock to select the current source, noise which is generated by switching a primary current source with a backup current source is spread out over a wider frequency range.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A current source calibration circuit comprising:
   first and second current sources;
   a calibration circuit;
   a clock generator to provide a clock signal having a sequence of pulses with pseudo-random periods; and
   a switching circuit to pseudo-randomly coupling the first and second current sources to the calibration circuit in response to the clock signal.

2. The current source calibration circuit of claim 1 wherein the first and second current sources are provided in a digital-to-analog (DAC) circuit.

3. The current source calibration circuit of claim 1 wherein the clock generator comprises a shift register.

4. A digital-to-analog (DAC) circuit comprising:
   a plurality of sub-DACs each comprising at least one current source;
   a calibration circuit coupleable to calibrate the current sources; and
   a clock generator circuit coupled to the calibration circuit to provide a plurality of clock signals each having a sequence of pulses with pseudo-random periods.

5. The DAC of claim 4 wherein the plurality of clock signals has different phases.

6. The DAC of claim 4 further comprising a plurality of backup current sources.

7. The DAC of claim 4 wherein the clock generator circuit comprises a shift register circuit.

8. A digital-to-analog (DAC) circuit comprising:
   a plurality of sub-DACs each comprising,
       a primary current source,
       a backup current source, and
       switching circuitry to couple the primary and backup current sources to calibration circuitry; and
   a clock generator circuit coupled to the switching circuitry to provide a plurality of clock signals each having a sequence of pulses with pseudo-random periods.

9. The DAC of claim 8 wherein the plurality of clock signals have different phases.

10. The DAC of claim 8 wherein the switching circuitry comprises a shift register coupled to receive one of the plurality of clock signals.

11. The DAC of claim 8 wherein the clock generator comprises a linear feedback sift register having a plurality of output connections.

12. A method of calibrating a plurality of current sources comprising:
    generating a clock signal having a sequence of pulses with pseudo-random periods; and
    coupling the plurality of current sources to a calibration circuit in response to the clock signal.

13. The method of claim 12 wherein the clock signal is generated using a shift register circuit.

14. The method of claim 12 wherein the plurality of current sources comprise a primary and a secondary current source.

15. The method of claim 14 wherein coupling the current sources comprises alternately coupling the primary and secondary current sources to the calibration circuit on a transition of the clock signal.

16. A method of calibrating a digital-to-analog (DAC) converter circuit comprising:
    generating first and second clock signals each having a sequence of pulses with pseudo-random periods, wherein the first and second clock signals have different phases;
    generating switching clock signals from the first and second clock signals; and
    coupling current sources of the DAC to a calibration circuit in response to the switching clock signals.

17. The method of claim 16 wherein the DAC comprises first and second sub-DACs each having current sources, wherein the switching clock signals comprise first and second switching clock signals generated from the first and second clock signals, respectively.

18. The method of claim 17 wherein the current sources of the first sub-DAC are coupled to the calibration circuit in response to the first switching clock signals, and the second sub-DAC are coupled to the calibration circuit in response to the second switching clock signals.

* * * * *